United States Patent
Matsumoto (10) Patent No.: US 9,070,704 B2
(45) Date of Patent: Jun. 30, 2015

(54) METHOD FOR MANUFACTURING SEMICONDUCTOR DEVICE WITH RECESS, EPITAXIAL GROWTH AND DIFFUSION

(71) Applicant: Sony Corporation, Tokyo (JP)

(72) Inventor: Takuji Matsumoto, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 10 days.

(21) Appl. No.: 13/913,012

(22) Filed: Jun. 7, 2013

(65) Prior Publication Data

US 2013/0295741 A1    Nov. 7, 2013

Related U.S. Application Data

(60) Continuation of application No. 13/238,580, filed on Sep. 21, 2011, now Pat. No. 8,486,793, which is a division of application No. 12/137,112, filed on Jun. 11, 2008, now Pat. No. 8,039,901.

(30) Foreign Application Priority Data

Jun. 27, 2007  (JP) ................................. 2007-169023

(51) Int. Cl.
*H01L 21/336*    (2006.01)
*H01L 21/36*     (2006.01)
(Continued)

(52) U.S. Cl.
CPC .. *H01L 29/66431* (2013.01); *H01L 21/823807* (2013.01); *H01L 21/823814* (2013.01); *H01L 29/665* (2013.01); *H01L 29/6656* (2013.01); *H01L 29/66636* (2013.01); *H01L 29/7834* (2013.01); *H01L 29/7843* (2013.01); *H01L 29/7848* (2013.01)

(58) Field of Classification Search
CPC ................. H01L 21/823814; H01L 29/66636
USPC .......................... 438/285, 300, 481, 429, 607
See application file for complete search history.

(56) References Cited

U.S. PATENT DOCUMENTS 7,348,248 B2 *   3/2008   Cheng ........................... 438/301
2005/0184345 A1   8/2005   Lin
(Continued)

FOREIGN PATENT DOCUMENTS

JP      09-074188      3/1997
JP      2006-165012    6/2006
(Continued)

OTHER PUBLICATIONS

Japanese Office Action dated Aug. 14, 2012 for Japanese Application No. 2007-169023.

(Continued)

*Primary Examiner* — Jerome Jackson, Jr.
*Assistant Examiner* — Paul Budd
(74) *Attorney, Agent, or Firm* — Dentons US LLP (57) ABSTRACT

A semiconductor device including a gate electrode disposed on a semiconductor substrate and source/drain regions disposed at both sides of the gate electrode, the source/drain regions being formed by implanting impurities. The source/drain regions include an epitaxial layer formed by epitaxially growing a semiconductor material having a different lattice constant from that of the semiconductor substrate in a recessed position at a side of the gate electrode, and a diffusion layer disposed in a surface layer of the semiconductor substrate.

12 Claims, 8 Drawing Sheets

(51) Int. Cl.
*H01L 29/66* (2006.01)
*H01L 21/8238* (2006.01)
*H01L 29/78* (2006.01)

(56) References Cited

U.S. PATENT DOCUMENTS

| | | | |
|---|---|---|---|
| 2006/0220113 A1 | 10/2006 | Tamura et al. | |
| 2006/0255365 A1* | 11/2006 | Ko et al. | 257/192 |
| 2007/0012913 A1 | 1/2007 | Ohta et al. | |
| 2007/0026326 A1 | 2/2007 | Kim et al. | |
| 2007/0290192 A1* | 12/2007 | Rotondaro | 257/19 |
| 2008/0054250 A1* | 3/2008 | Chuang et al. | 257/19 |
| 2008/0079033 A1* | 4/2008 | Waite et al. | 257/255 |
| 2008/0128746 A1* | 6/2008 | Wang | 257/190 |
| 2008/0199998 A1* | 8/2008 | Chen et al. | 438/275 |
| 2008/0237742 A1* | 10/2008 | Ranade et al. | 257/401 |
| 2009/0068810 A1* | 3/2009 | Tsai et al. | 438/300 |

FOREIGN PATENT DOCUMENTS

| | | |
|---|---|---|
| JP | 2006-229071 | 8/2006 |
| JP | 2007-034553 | 2/2007 |
| JP | 2007-110098 | 4/2007 |
| JP | 2008-504677 | 2/2008 |
| JP | 2008-060408 | 3/2008 |
| JP | 2008-511169 | 4/2008 |
| WO | 2006006972 A1 | 1/2006 |
| WO | 2006023183 A2 | 3/2006 |
| WO | 2007034553 A1 | 3/2007 |

OTHER PUBLICATIONS

Stanely Wolf, Silicon Processing for the VLSI Era, 2000, Lattice Press, vol. 1, p. 324.

Kah Wee Ang et al., Enhanced Performance in 50 nm N-MOSFETs with Silicon—Carbon Source/Drain Regions; Dec. 2004, IEDM Tech Dig., pp. 1069-1071.

* cited by examiner

METHOD FOR MANUFACTURING SEMICONDUCTOR DEVICE WITH RECESS, EPITAXIAL GROWTH AND DIFFUSION

RELATED APPLICATION DATA

This application is a continuation of U.S. patent application Ser. No. 13/238,580 filed Sep. 21, 2011, which is a division of U.S. patent application Ser. No. 12/137,112, filed Jun. 11, 2008, the entireties of which are incorporated herein by reference to the extent permitted by law. The present application claims priority to Japanese Patent Application JP 2007-169023 filed in the Japanese Patent Office on Jun. 27, 2007, the entirety of which also is incorporated by reference herein to the extent permitted by law.

BACKGROUND OF THE INVENTION

1. Field of the Invention

The present invention relates to semiconductor devices and methods for manufacturing semiconductor devices. More particularly, the invention relates to a semiconductor device in which semiconductor materials having different lattice constants are epitaxially grown in recessed portions at the sides of gate electrodes and a method for manufacturing the same.

2. Description of the Related Art

In semiconductor devices provided with MOS transistors, techniques that improve carrier mobility by application of stress to channel regions of a semiconductor substrate have been actively used. As one of such techniques, use of a structure shown in FIG. 11 has been proposed. In this structure, the surface of a semiconductor substrate 101 is isolated by isolation films 102, and gate electrodes 104 are disposed so as to extend across an isolated active region 103, and recessed portions are provided at both sides of the gate electrodes 104. Epitaxial layers 105 composed of a semiconductor material having a different lattice constant from that of the semiconductor substrate 101 are disposed in the recessed portions, and serve as source/drain regions.

Figure 11:
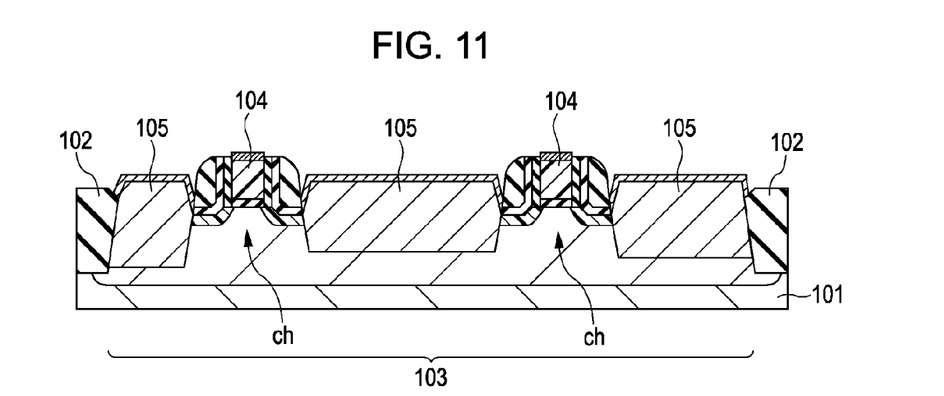
FIG. 11 is a schematic cross-sectional view showing a structure of a semiconductor device according to the related art.

In such a case, for example, in p-type MOS (PMOS) transistors, silicon germanium (SiGe) having a larger lattice constant than silicon (Si) constituting the semiconductor substrate 101 is grown into the epitaxial layers 105. Thereby, compressive stress is applied to channel regions ch, and the carrier mobility is improved. For example, refer to Japanese Unexamined Patent Application Publication No. 2006-165012 (Patent Document 1).

Meanwhile, in n-type MOS (NMOS) transistors, silicon carbon (SiC) having a smaller lattice constant than silicon (Si) constituting the semiconductor substrate 101 is grown into the epitaxial layers 105. Thereby, tensile stress is applied to channel regions ch, and the carrier mobility is improved. For example, refer to Kah Wee Ang, et al., "Enhanced Performance in 50 nm N-MOSFETs with Silicon-Carbon Source/Drain Regions", December 2004, IEDM Tech. Dig., 1069-1071 (Non-patent Document 1).

SUMMARY OF THE INVENTION

In the semiconductor device having the structure described above, in order to ensure that the characteristics of the transistors are equal to one another, it is important to suppress the variation in stress applied to the channel regions. The stress applied to the channel regions is controlled by the depth of the epitaxial layers, i.e., the depth of the recesses formed in the semiconductor substrate.

However, the depth of the recess in the semiconductor substrate decreases as the recessed area decreases due to a microloading effect that occurs during an etching process for recessing the semiconductor substrate. Consequently, the depth of the epitaxial layers varies depending on the layout of the gate electrodes on the semiconductor substrate (in the active region).

Furthermore, with respect to an epitaxial layer composed of silicon germanium (SiGe), as the layout area increases, the number of crystal defects increases, resulting in an increase in junction leakage.

Furthermore, in a MOS transistor, the layout area can be decreased by employing a structure in which a diffusion layer of opposite conductivity type is disposed adjacent to one of source and drain regions, and one of source and drain regions and the diffusion layer of opposite conductivity type are short-circuited by a silicide layer disposed as a surface layer. In such a structure, in the case where epitaxial layers composed of silicon germanium (SiGe) are used for source/drain regions of a PMOS transistor, an n-type diffusion layer formed by diffusing an n-type impurity, such as arsenic (As) or phosphorus (P), in a surface layer of a semiconductor substrate is provided as a diffusion layer of opposite conductivity type.

However, the diffusion rate of the n-type impurity in SiGe is higher than in a semiconductor substrate composed of silicon, i.e., in the case of arsenic (As), about seven times higher, and in the case of phosphorus (P), about two times higher. Consequently, the n-type impurity in the diffusion layer of opposite conductivity type (n-type diffusion layer) is diffused into the adjacent source/drain regions (epitaxial layers composed of SiGe) and easily reaches the channel region, thus increasing the threshold of the MOS transistor.

It is desirable to provide a semiconductor device including epitaxial layers, the depth of which is controlled without depending on the layout, and in which crystal defects are prevented from occurring, thus enabling improvement in characteristics, and to provide a method for manufacturing the semiconductor device.

According to an embodiment of the present invention, a semiconductor device includes a gate electrode disposed on a semiconductor substrate and source/drain regions disposed at both sides of the gate electrode, the source/drain regions being formed by implanting impurities. The source/drain regions include an epitaxial layer formed by epitaxially growing a semiconductor material having a different lattice constant from that of the semiconductor substrate in a recessed position at a side of the gate electrode, and a diffusion layer disposed in a surface layer of the semiconductor substrate.

According to another embodiment of the present invention, a method for manufacturing a semiconductor device includes a first step of forming a gate electrode on a semiconductor substrate, a second step of recessing a surface layer of the semiconductor substrate at a side of the gate electrode by etching through a mask pattern, a third step of forming an epitaxial layer composed of a semiconductor material having a different lattice constant from that of the semiconductor substrate on the recessed portion of the semiconductor substrate, and a fourth step of forming source/drain regions by removing the mask pattern to expose the surface layer of the semiconductor substrate and diffusing impurities into the epitaxial layer and the surface layer of the semiconductor substrate, the source/drain regions including the epitaxial layer in which impurities are diffused and a diffusion layer formed by diffusing impurities into the surface layer.

In the semiconductor device and the method for manufacturing the semiconductor device according to the embodiments of the present invention, the source/drain regions include the epitaxial layers and the diffusion layers. Consequently, the width of the epitaxial layers is adjusted by changing the width of the diffusion layers. Thus, without depending on the layout, the width of the recessed portions of the semiconductor substrate, in which the epitaxial layers are to be formed, is controlled, and the depth of the recessed portions recessed by etching is controlled. Consequently, for example, by setting the width of the epitaxial layers to be a predetermined value by changing the width of the diffusion layers, the depth of the recessed portions of the semiconductor substrate in which the epitaxial layers are disposed is equalized, without depending on the layout. Furthermore, since the formation area (layout area) of the epitaxial layers is reduced by portions corresponding to the diffusion layers, without depending on the layout, it is possible to obtain epitaxial layers having a small number of crystal defects.

As described above, according to the embodiments of the present invention, the depth of the recessed portions of the semiconductor substrate in which the epitaxial layers are disposed can be controlled without depending on the layout. Consequently, it is possible to suppress the variation in stress applied to channel regions beneath gate electrodes by the epitaxial layers with controlled depth. Furthermore, since epitaxial layers having a small number of crystal defects can be obtained without depending on the layout, junction leakage can be reduced. As a result, the characteristics of the semiconductor device can be improved.

DESCRIPTION OF THE PREFERRED EMBODIMENTS

The embodiments of the present invention will be described in detail with reference to the drawings. Here, structures of a semiconductor device having a plurality of MOS transistors disposed on a substrate will be described.

First Embodiment

Figure 1:
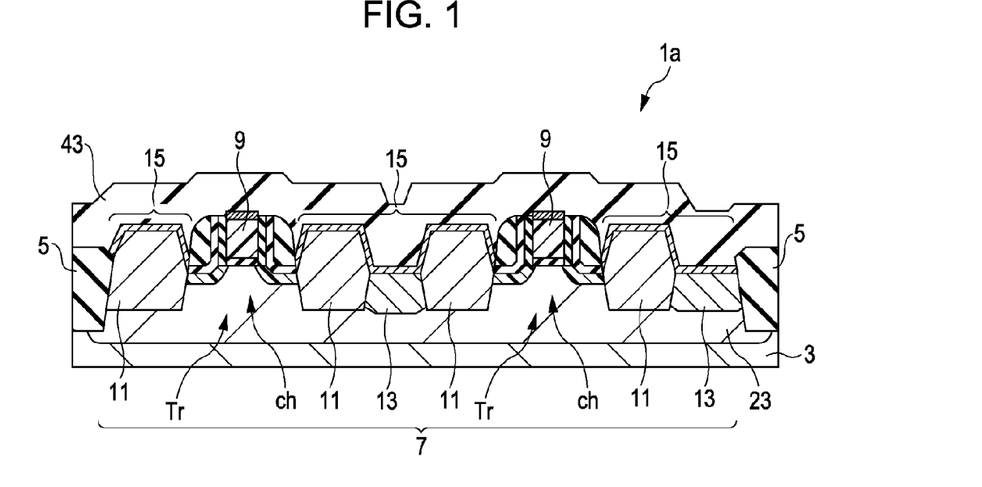
FIG. 1 is a schematic cross-sectional view showing a structure of a semiconductor device according to a first embodiment of the present invention.

FIG. 1 is a schematic cross-sectional view showing a structure of a semiconductor device according to a first embodiment. In a semiconductor device 1a shown in FIG. 1, a surface of a semiconductor substrate 3 composed of silicon (Si) is isolated by isolation films 5, and gate electrodes 9 are disposed so as to extend across an isolated active region 7. At both sides of the gate electrodes 9, the surface of the semiconductor substrate 3 is recessed. Epitaxial layers 11 composed of a semiconductor material having a different lattice constant from that of the semiconductor substrate 3 are disposed in the recessed portions, and impurities are diffused into the epitaxial layers 11. Furthermore, with respect to the gate electrodes 9, diffusion layers 13 are disposed outside the epitaxial layers 11, the diffusion layers 13 being formed by diffusing impurities into a surface layer of the semiconductor substrate 3.

In the first embodiment, at both sides of the gate electrodes 9, the epitaxial layers 11 and the diffusion layers 13, in which impurities are diffused, constitute source/drain regions 15.

The epitaxial layer 11 provided at each of both sides of each gate electrode 9 is formed so as to have a predetermined width W controlled by the corresponding diffusion layer 13. For example, MOS transistors of the same standard are assumed to be provided with substantially the same predetermined width W in the channel length direction. Consequently, the diffusion layers 13 are provided only partially outside the epitaxial layers 11 so that the epitaxial layers 11 have the same width. Furthermore, the predetermined width W in the channel length direction of the epitaxial layers 11 is about 10 to 100 nm.

In p-type MOS (PMOS) transistors among the MOS transistors provided on the semiconductor device 1a, silicon germanium (SiGe) having a larger lattice constant than silicon (Si) constituting the semiconductor substrate 3 is used for the epitaxial layers 11. Thereby, compressive stress is applied to channel regions ch.

Meanwhile, in n-type MOS (NMOS) transistors among the MOS transistors provided on the semiconductor device 1a, silicon carbon (SiC) having a smaller lattice constant than silicon (Si) constituting the semiconductor substrate 3 is used for the epitaxial layers 11. Thereby, tensile stress is applied to channel regions ch.

Next, the detailed structure of the semiconductor device 1a will be described with reference to FIGS. 2A to 5D.

Figure 2A:
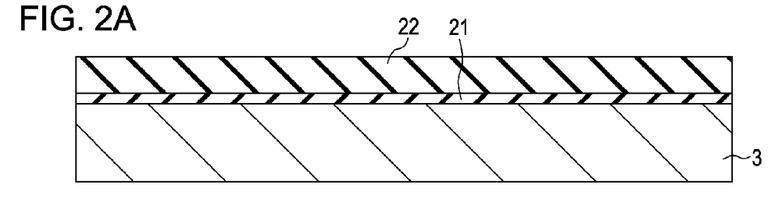
FIGS. 2A to 2E are schematic cross-sectional views showing steps in a method for manufacturing a semiconductor device according to the first embodiment.

First, as shown in FIG. 2A, a semiconductor substrate 3 composed of single-crystal silicon is prepared. The semiconductor substrate 3 has, for example, a resistivity of about 10 mmΩ·cm. As the semiconductor substrate 3, silicon-on-insulator (SOI) or a substrate including a SiGe layer may be used as long as a surface layer of the substrate is composed of single-crystal silicon.

Next, a pad oxide film 21 with a thickness of about 15 nm is formed by thermal oxidation on the surface layer of the semiconductor substrate 3. Then, a silicon nitride film 22 with a thickness of about 160 nm is deposited by low-pressure CVD (LP-CVD). Besides the structure in which the silicon nitride film 22 is disposed on the pad oxide film 21, it may also be possible to use a structure in which a silicon nitride film is disposed on a polysilicon film, or a structure in which a silicon nitride film is disposed on a pad oxide film.

Figure 2B:
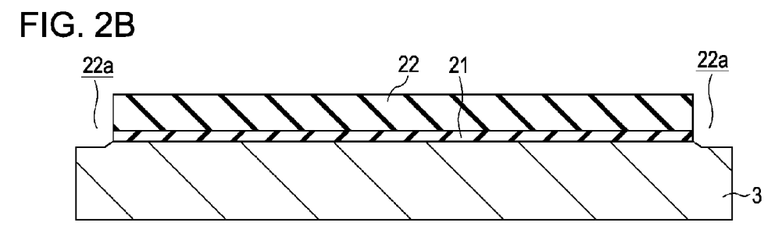

Next, as shown in FIG. 2B, openings 22a corresponding to isolation film-forming portions are formed in the silicon nitride film 22 and the pad oxide film 21. Here, a resist pattern (not shown) is formed by lithography, and using the resist pattern as a mask, the silicon nitride film 22 and the pad oxide film 21 are etched. In order to perform the etching process, a reactive ion etching (RIE) system, an electron cyclotron resonance (ECR) system, or the like is used. After the etching process, the resist pattern is removed using an asking system or the like.

Figure 2C:
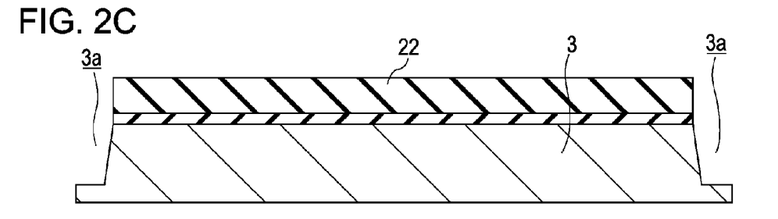

Next, as shown in FIG. 2C, the semiconductor substrate 3 is etched using the silicon nitride film 22 provided with the openings 22a as a mask, and thereby, trenches 3a for forming isolation films are formed in the semiconductor substrate 3. The depth of the trenches 3a is about 0.3 µm. In order to perform the etching process, a reactive ion etching (RIE) system, an electron cyclotron resonance (ECR) system, or the like is used.

In this state, by performing a thermal oxidation process, a liner oxide film (not shown) is formed with a thickness of about 4 to 10 nm. The thermal oxidation process is carried out at about 800° C. to 900° C. The liner oxide film may be an oxide film containing nitrogen. Instead of the liner oxide film, a nitride film may be deposited by CVD.

Figure 2D:
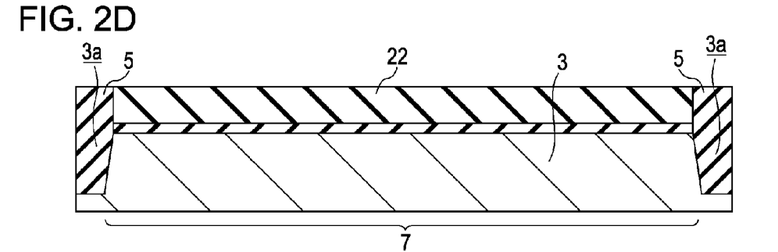

Next, as shown in FIG. 2D, isolation films 5 are formed by filling the trenches 3a with insulating films, and the surface of the semiconductor substrate 3 is separated into a plurality of active regions 7. The isolation films 5 are formed by depositing an insulating film, such as a high density plasma (HDP) oxide film, an inorganic film, such as a spin-on-glass (SOG) film, an organic oxide film, or the like so as to fill the trenches 3a, and then polishing the insulating film by chemical mechanical polishing (CMP) until the silicon nitride film 22 is exposed.

Figure 2E:
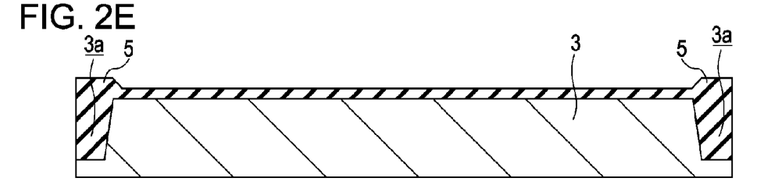

Next, as shown in FIG. 2E, in order to adjust the height of the isolation films 5 with respect to the surface of the semiconductor substrate 3, the insulating films (e.g., oxide films) filled in the trenches 3a are subjected to wet etching. The etching thickness is, for example, about 40 to 100 nm. Next, the silicon nitride film 22 is removed with hot phosphoric acid to expose the pad oxide film 21.

Figure 3A:
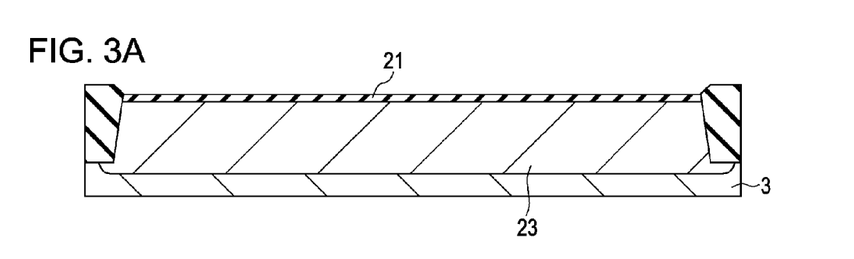
FIGS. 3A to 3D are schematic cross-sectional views showing steps subsequent to the step shown in FIG. 2E in the method for manufacturing a semiconductor device according to the first embodiment.

Next, as shown in FIG. 3A, a well diffusion layer 23 is formed in the surface layer of the semiconductor substrate 3, and channel implantation is performed. Here, using resist patterns as masks, ion implantation is performed individually for each of a region where p-type MOS transistors are formed (hereinafter referred to as a "PMOS region") and a region where n-type MOS transistors are formed (hereinafter referred to as an "NMOS region").

In the PMOS region, an n-type well diffusion layer 23 is formed. In such a case, phosphorus (P) ions are implanted at a dose of about 1E13 atoms/cm$^2$ with an implantation energy of 200 KeV. Furthermore, in channel implantation, arsenic (As) ions are implanted at a dose of about 1E11 to 2E13 atoms/cm$^2$ with an implantation energy of 100 keV.

Meanwhile, in the NMOS region, a p-type well diffusion layer 23 is formed. In such a case, boron (B) ions are implanted at a dose of about 1E13 atoms/cm$^2$ with an implantation energy of 200 keV. Furthermore, in channel implantation, boron (B) ions are implanted at a dose of about 1E11 to 2E13 atoms/cm$^2$ with an implantation energy of 10 to 20 KeV.

After the ion implantation process is completed, the resist pattern is removed. Furthermore, the pad oxide film 21 is removed by wet etching.

Figure 3B:
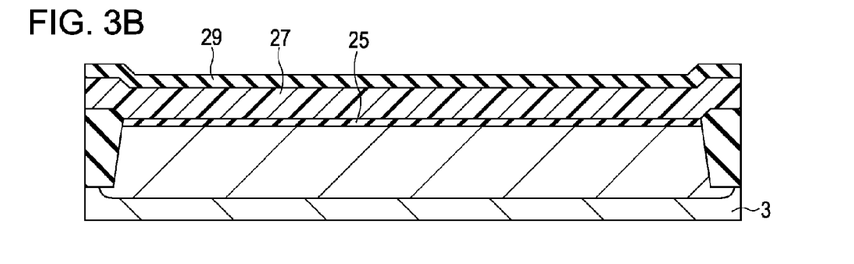

Next, as shown in FIG. 3B, a gate insulating film 25 is formed over the surface of the semiconductor substrate 3. In this process, a thick gate insulating film 25 is formed in a region where high-voltage MOS transistors are formed, and a thin gate insulating film 25 is formed in a region where low-voltage MOS transistors are formed.

First, a thick gate insulating film 25 composed of silicon oxide is formed. For example, in MOS transistors designed for a power supply voltage of 3.3 V, the thickness is about 7.5 nm, and in MOS transistors designed for a power supply voltage of 2.5 V, the thickness is about 5.5 nm. Then, the thick gate insulating film 25 in the region where low-voltage MOS transistors are formed is removed by etching using a resist pattern as a mask.

Next, a thin gate insulating film 25 is formed in the region where low-voltage MOS transistors are formed, a thin gate insulating film 25 is formed. For example, in MOS transistors designed for 1.0 V, the thickness is about 1.2 to 1.8 nm.

The gate insulating film 25 may be a thermally oxidized film or an oxynitride film formed by rapid thermal oxidation (RTO). Furthermore, in order to further reduce gate leakage, it may also be possible to use a high-dielectric film made of Hf-based or Zr-based oxide.

Next, a polysilicon film 27 for constituting gate electrodes is deposited by LPCVD on the gate insulating film 25. The thickness of the polysilicon film 27 depends on the technology node, and is about 150 to 200 nm at the 90-nm node. Furthermore, in general, the thickness tends to decrease with node in order not to increase the gate aspect ratio in view of process controllability.

Next, impurities are implanted into the polysilicon film 27 as measures for preventing gate depletion. In this step, using resist patterns as masks, phosphorus (P) or arsenic (As) is ion-implanted into the NMOS region, and boron (B), boron fluoride (BF$_2$), or indium (In) is ion-implanted into the PMOS region. The implantation dose is about 1E15 to 1E16 atoms/cm$^2$. Here, the term "measures for preventing gate depletion" refers to measures for coping with the fact that, as the thickness of the gate insulating film decreases, the effects of not only the physical thickness of the gate insulating film but also the thickness of the depletion layer in the gate polysilicon film become non-negligible, and the effective thickness of the gate film does not decrease, resulting in a decrease in the Tr. performance.

In such a case, in order to prevent the impurities implanted into the polysilicon film 27 from penetrating a region beneath the gate insulating film 25, nitrogen (N$_2$) may be implanted in combination.

Furthermore, as the measures for preventing gate depletion, instead of the polysilicon film for constituting gate electrodes, a SiGe polycrystalline film may be deposited; gate electrodes may be fully silicidated; or metal gates may be used.

Next, a mask layer 29 which serves as a mask during the gate fabrication process is formed on the polysilicon film 27. As the mask layer 29, a silicon oxide film, a silicon nitride film, or the like is used. The thickness of the mask layer 29 is about 10 to 100 nm.

Figure 3C:
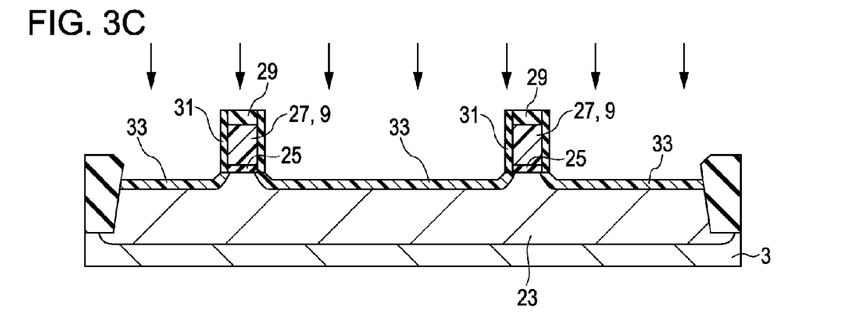

Next, as shown in FIG. 3C, the mask layer 29 is patterned into gate electrode shapes by etching using an RIE system or the like with a resist pattern used as a mask. After the etching process is completed, the resist pattern is removed.

Then, the polysilicon film 27 is etched through the patterned mask layer 29 using an RIE system or the like to form gate electrodes 9 composed of patterned polysilicon film 27. Furthermore, in this process, the gate insulating film 25 may also be patterned by etching.

Next, offset spacers 31 are formed on sidewalls of the gate electrodes 9. In this step, first, an insulating film for offset spacers composed of a TEOS film, HTO film, silicon nitride film, or the like is deposited, and the insulating film is subjected to an etch-back process using an RIE system to obtain the offset spacers 31. By disposing the offset spacers 31 on the sidewalls of the gate electrodes 31, the effective channel length is increased, and the short channel effect can be reduced. Furthermore, before the offset spacers 31 are formed, it may be possible to carry out a step of oxidizing the sidewalls of the gate electrodes by RTO or the like. This step has the effect of reducing gate overlap capacitance which is parasitic capacitance.

Next, pocket implantation is performed on the surface of the semiconductor substrate 3 at the sides of the gate electrodes 9 (the profile is not shown in the drawings), and extension diffusion layers 33 are formed. In this step, using resist patterns as masks, ion implantation is performed individually for each of the PMOS region and the NMOS region.

In the pocket implantation in the PMOS region, arsenic (As) or phosphorus (P) is implanted at a dose of about 1E12 to 1E14 atoms/cm$^2$. In the extension diffusion layers 33, boron (B), boron fluoride (BF$_2$), or indium (In) is ion-implanted at a dose of about 1E15 to 2E15 atoms/cm$^2$.

Meanwhile, in the pocket implantation in the NMOS region, boron (B), boron fluoride (BF$_2$), or indium (In) is ion-implanted at a dose of about 1E12 to 1E14 atoms/cm$^2$. In the extension diffusion layers 33, arsenic (As) or phosphorus (P) is ion-implanted at a dose of about 1E14 to 2E15 atoms/cm$^2$. In addition, when the structure according to the embodiment of the present invention is applied to the NMOS region, the formation of the extension diffusion layers 33 may be omitted.

Furthermore, before the pocket implantation is performed on the NMOS region and the PMOS region, in order to suppress channeling in the implantation, pre-amorphization may be performed, for example, by implanting Ge. Furthermore, in order to reduce implantation defects which may cause transient enhanced diffusion (TED) or the like after the formation of the extension diffusion layers 33, rapid thermal annealing (RTA) treatment at about 800° C. to 900° C. may be additionally performed.

Figure 3D:
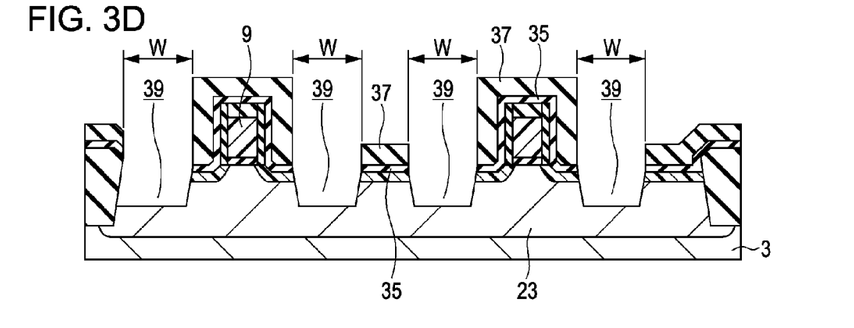

The step shown in FIG. 3D is one of the characteristic steps according to the embodiment of the present invention.

That is, first, a silicon oxide film 35 with a thickness of about 10 nm and a silicon nitride film 37 with a thickness of about 50 nm are formed in that order by CVD. Although not shown in the drawing, a silicon oxide film may be further deposited thereon.

Next, the laminated film including the silicon oxide film 35 and the silicon nitride film 37 is subjected to patterning by etching using a resist pattern (i.e., a mask pattern, not shown). In this step, the silicon oxide film 35 and the silicon nitride film 37 are subjected to patterning such that openings with a predetermined width W in the channel length direction are provided at both sides of the gate electrodes 9 through a sidewall composed of the laminated film including the silicon oxide film 35 and the silicon nitride film 37. Thereby, the laminated film including the silicon oxide film 35 and the silicon nitride film 37 are partially allowed to remain outside the portion with the predetermined width W on each side of each gate electrode 9.

Note that, for example, MOS transistors of the same standard are assumed to have substantially the same predetermined width W.

Next, recess etching is performed by RIE using the resist pattern as a mask, in which the semiconductor substrate 3 is recessed. Thereby, recessed portions 39 with the predetermined width W are formed in the surface of the semiconductor substrate 3 (well diffusion layer 23). The depth of the recessed portions is about 150 nm. The junction depth of the source/drain regions is determined by the depth of the recessed portions and annealing treatment which is performed later. Consequently, as the technology node advances, miniaturization proceeds, and the etching depth decreases.

After the etching process is completed, the resist pattern is removed.

Figure 4A:
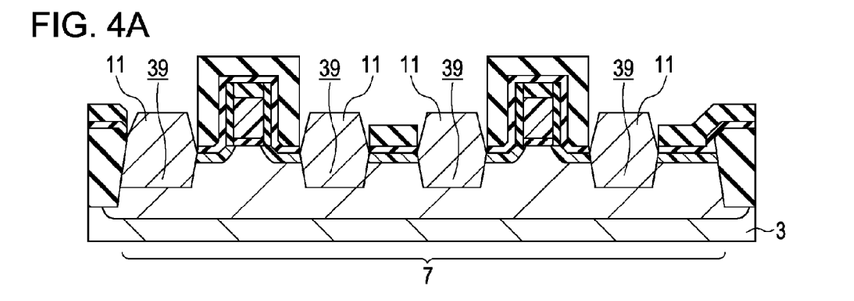
FIGS. 4A to 4D are schematic cross-sectional views showing steps subsequent to the step shown in FIG. 3D in the method for manufacturing a semiconductor device according to the first embodiment.

Next, as shown in FIG. 4A, on the surface of the recessed semiconductor substrate 3, i.e., in the recessed portions 39, epitaxial layers 11 composed of a semiconductor material having a different lattice constant from that of the semiconductor substrate 3 are formed.

As described above with reference to FIG. 1, in the PMOS region, silicon germanium (SiGe) having a larger lattice constant than silicon (Si) constituting the semiconductor substrate 3 is used for the epitaxial layers 11. In this process, the NMOS region is kept covered with the silicon oxide film or the laminated film including the silicon oxide film and the silicon nitride film. Silicon germanium (SiGe) containing boron (B) is epitaxially grown at 600° C. to 800° C. using dichlorosilane (Si2H$_2$Cl$_2$), diborane (B$_2$H$_6$), hydrogen chloride (HCl), hydrogen (H$_2$), etc. as gas species.

Meanwhile, in the NMOS region, silicon carbon (SiC) having a smaller lattice constant than silicon (Si) constituting the semiconductor substrate 3 is used for the epitaxial layers 11. In this process, the PMOS region is kept covered with the silicon oxide film or the laminated film including the silicon oxide film and the silicon nitride film. Silicon carbon (SiC) containing phosphorus (P) is epitaxially grown at 600° C. to 800° C. using silane (SiH$_4$), propane (C$_3$H$_6$), phosphine (PH$_3$), hydrogen chloride (HCl), etc. as gas species.

Figure 4B:
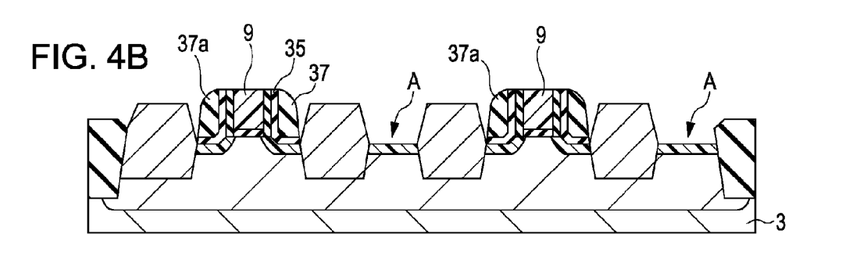

Next, as shown in FIG. 4B, the laminated film including the silicon oxide film 35 and the silicon nitride film 37 is subjected to an etch-back process to form sidewalls 37a at the sides of the gate electrodes 9. Thereby, a surface A of the semiconductor substrate 3 is exposed in parts of the active region 7.

Figure 4C:
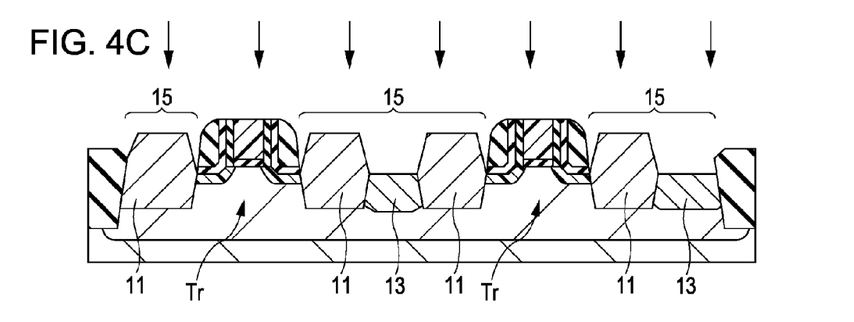

Next, as shown in FIG. 4C, source/drain regions 15 are formed. In this step, using resist patterns as masks, ion implantation is performed individually for each of the PMOS region and the NMOS region.

In the PMOS region, as a p-type impurity, boron (B) or boron fluoride (BF$_2$) is ion-implanted at a dose of 1E15 to 1E16 atoms/cm$^2$.

Meanwhile, in the NMOS region, as an n-type impurity, arsenic (As) or phosphorus (P) is ion-implanted at a dose of 1E15 to 1E16 atoms/cm$^2$.

After the ion implantation process is completed, the resist patterns are removed, and activation annealing is performed at about 800° C. to 1,100° C. An RTA system, a spike-RTA system, or the like is used.

Thereby, p-type or n-type MOS transistors Tr are obtained, each of the MOS transistors including the gate electrode 9 and source/drain regions 15 disposed at both sides of the gate electrode 9, the source/drain regions 15 each including the epitaxial layer 11 in which impurities are diffused and the diffusion layer 13.

Figure 4D:
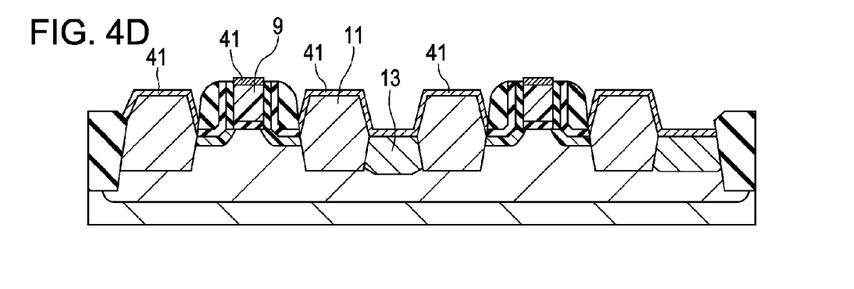

Next, as shown in FIG. 4D, a silicide layer is formed by silicidating the exposed surface of silicon. In this step, first, wet etching treatment is performed on the native oxide film, and a metal film, for example, composed of nickel (Ni) is deposited at a thickness of about 10 nm using a sputtering system. Then, exposed portions of silicon are silicidated by performing annealing treatment at about 300° C. to 400° C. The metal film remaining after the silicidation is removed by wet etching. Then, annealing treatment is performed at about 500° C. to 600° C. to form a silicide layer 41 composed of nickel silicide. The silicide layer 41 is formed in a self-aligned manner only on the gate electrodes 9 composed of polysilicon, epitaxial layers 11 composed of silicon germanium (SiGe), and the diffusion layers 13 composed of single-crystal silicon.

Furthermore, as the metal film, cobalt (Co), titanium (Ti), platinum (Pt), tungsten (W), or the like may be used besides nickel (Ni). In such a case, cobalt silicide ($CoSi_2$), titanium silicide ($TiSi_2$), platinum silicide (PtSi), tungsten silicide ($WSi_2$), or the like is obtained.

Figure 5A:
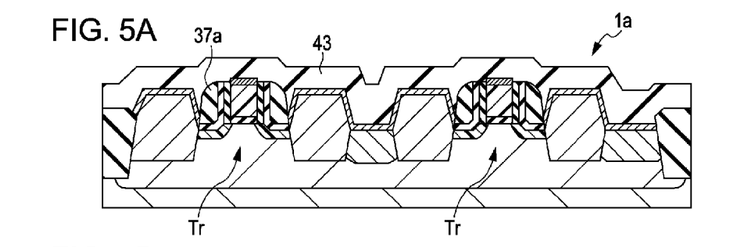
FIGS. 5A to 5D are schematic cross-sectional views showing steps subsequent to the step shown in FIG. 4D.

Next, as shown in FIG. 5A, a stress film 43 composed of silicon nitride is formed over the gate electrodes 9, the epitaxial layers 11, and the diffusion layers 13. In this step, different stress films 43 are formed so that tensile stress is applied to a region where n-type MOS transistors Tr are disposed and compressive stress is applied to a region where p-type MOS transistors Tr are disposed.

First, as a stress film 43, a silicon nitride film (Tensile Si3N4) which imparts tensile stress is deposited at a thickness of about 5 to 100 nm by LPCVD, p-CVD, or the like. Next, as a stopper film (not shown) used for the processing of the stress film 43, a silicon oxide film (TEOS film, PSG film, BPSG film, SOG film, or the like) is deposited at a thickness of about 100 nm by CVD or the like. Then, the stopper film in the region where p-type MOS transistors Tr are disposed is removed by etching using a resist pattern as a mask, and using the stopper film as a mask, the stress film 43 is removed. In this stage, the sidewall films of pFETs are also removed due to etch selectivity/over-etching.

Thereby, the region where n-type MOS transistors Tr are disposed is covered with the stress film 43 which applies tensile stress to the channel regions ch.

Next, as a stress film 43, a silicon nitride film (Compressive Si3N4) which imparts compressive stress is deposited at a thickness of about 5 to 100 nm by CVD or the like. Then, in the region where n-type MOS transistors Tr are disposed, such a stress film 43 which imparts compressive stress is removed.

Thereby, the region where p-type MOS transistors Tr are disposed is covered with the stress film 43 which applies compressive stress to the channel regions ch.

A semiconductor device 1a having the same structure as that shown in FIG. 1 is obtained by the steps described above. Subsequent steps will be described below.

Figure 5B:
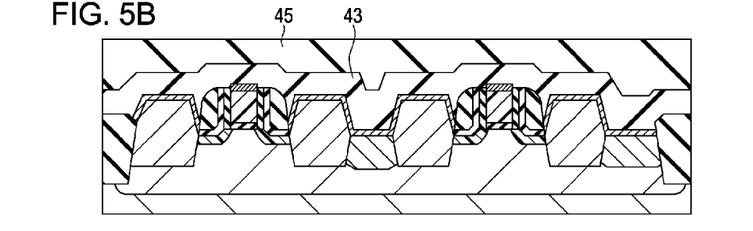

First, as shown in FIG. 5B, a silicon oxide film 45, such as a TEOS film, PSG film, BPSG film, or SOG film, is deposited by CVD at a thickness of about 100 to 1,000 nm so as to cover the stress film 43, and planarization is performed by CMP.

Figure 5C:
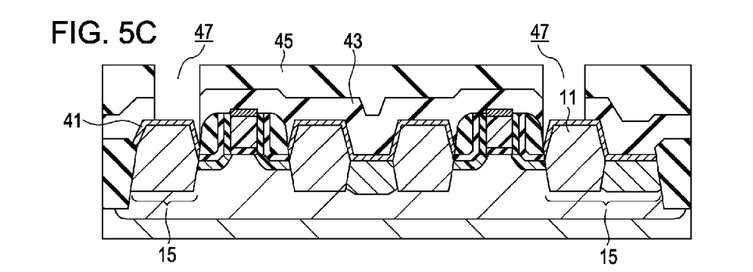

Next, as shown in FIG. 5C, via holes 47 are formed in the silicon oxide film 45 and the stress film 43 so as to reach the silicide layer 41 on the surface of the source/drain regions 15. In this step, RIE is performed using a resist pattern (not shown) as a mask. After the via holes 47 are formed by RIE, the resist pattern is removed.

Figure 5D:
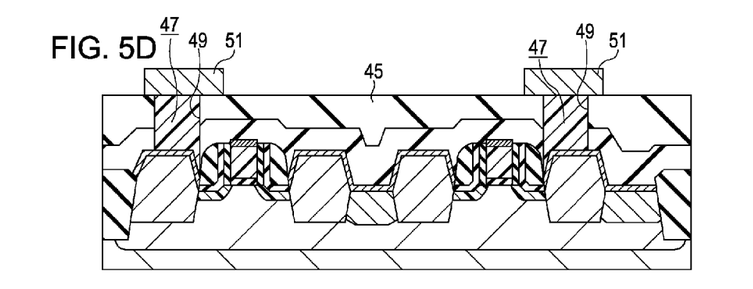

Then, as shown in FIG. 5D, contacts 49 are formed by filling the via holes 27 with a conductive material. In this step, first, a laminated film of titanium nitride (TiN)/titanium (Ti) is deposited as a barrier film by sputtering or CVD, and then a tungsten (W) film is deposited by CVD. The thickness of the tungsten film is about 100 to 500 nm. Next, the tungsten film is subjected to CMP or an etch-back process, and thereby the contacts 49 are formed by filling only the inside of the via holes 47.

Next, interconnect lines 51 connected to the contacts 49 are formed on the silicon oxide film 45. In this step, first, an aluminum (Al) film is deposited by sputtering, and then the aluminum film is subjected to pattern etching by RIE using a resist pattern as a mask. Thereby, interconnect lines 51 made of aluminum are formed. As the material for the interconnect lines 51, copper (Cu) having lower resistance may be used.

Although the subsequent steps are not shown in the drawing, by forming interconnect lines in an upper layer or layers, a multilayer interconnection structure including two layers, three layers, four layers, or more layers may be formed. Thereby, it is possible to obtain a semiconductor device having a multilayer interconnection structure.

According to the first embodiment described above, it is possible to obtain the semiconductor device 1a in which the source/drain regions 15 include the epitaxial layers 11 and the diffusion layers 13. Therefore, the width of the epitaxial layers 11 can be adjusted by changing the width of the diffusion layers 13.

Consequently, in the step described with reference to FIG. 3D, in which the recessed portions 39 having the predetermined width W corresponding to the width of the epitaxial layers are formed, by controlling the width of the recessed portions 39 to the predetermined width W without depending on the layout of the gate electrodes 9 in the active region 7, it is possible to form the recessed portions 39 at an etching depth taking the microloading effect during etching into consideration. Specifically, by setting the width of the recessed portions 39 to be the predetermined width W, it is possible to obtain the recessed portions 39 in which the variation in the etching depth due to the microloading effect is suppressed.

Consequently, the depth of the epitaxial layers 11 formed in the recessed portions 39 can be controlled and made uniform.

Furthermore, since the formation area (layout area) of the epitaxial layers 11 is reduced by portions corresponding to the diffusion layers 13, without depending on the layout, it is possible to obtain epitaxial layers 11 having a small number of crystal defects.

Consequently, it is possible to suppress the variation in stress applied to the channel regions ch beneath the gate electrodes 9 by the epitaxial layers 11 with the controlled predetermined depth. Furthermore, since the epitaxial layers 11 having a small number of crystal defects can be obtained without depending on the layout, junction leakage can be reduced. As a result, the characteristics of the transistors Tr can be improved.

Furthermore, although the volume of the epitaxial layers 11 is reduced by employing such a structure, it is possible to maintain the stress applied to the channel regions ch by setting the depth of the epitaxial layers 11 at a certain value (refer to K. Ota et al., "Scalable eSiGe S/D technology with less layout dependence for 45-nm generation", 2006 Symposium VLSI Technology Digest of Technical Papers, 2006).

Furthermore, as described above, since the formation area (layout area) of the epitaxial layers 11 is reduced by portions corresponding to the diffusion layers 13, the stress film 43 covering the sidewalls outside the epitaxial layers 11 is brought close to the channel regions ch. Thereby, the effect of applying stress to the channel regions ch by the stress film 43 can be enhanced.

Second Embodiment

Figure 6:
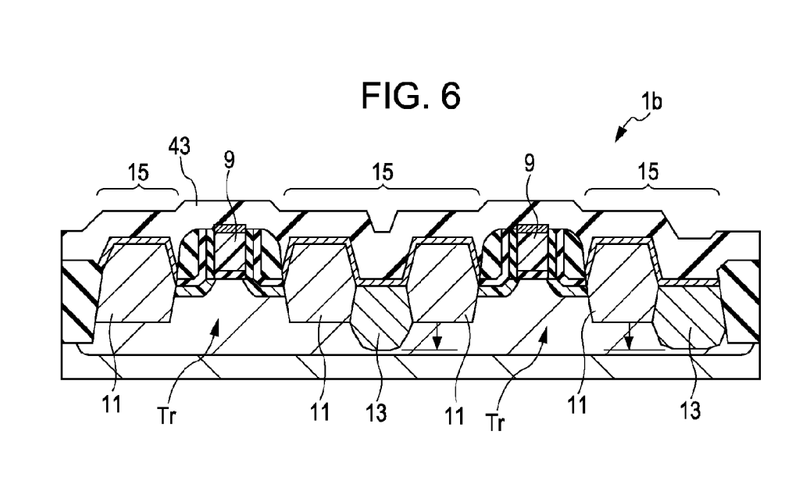
FIG. 6 is a schematic cross-sectional view showing a structure of a semiconductor device according to a second embodiment of the present invention.

FIG. 6 is a schematic cross-sectional view showing a structure of a semiconductor device according to a second embodiment of the present invention. A semiconductor device 1b shown in FIG. 6 has the same structure as the semiconductor device 1a shown in FIG. 1 according to the first embodiment except that the depth of diffusion layers 13 constituting source/drain regions 15 is larger than the depth of epitaxial layers 11.

In the semiconductor device 1b having such a structure, by increasing the depth of the diffusion layers 13 located outside the epitaxial layers 11 with respect to the gate electrodes 9, in addition to the effect of the first embodiment, while reducing the short channel effect, the electric field of the depletion layer at the p-n junction can be reduced, and thus junction leakage can be further improved. Furthermore, by increasing the depth of the diffusion layers 13, the substrate impurity concentration at the junction is decreased. Consequently, the junction capacitance can be decreased, and the operation speed of the MOS transistors Tr can be improved.

Third Embodiment

Figure 7:
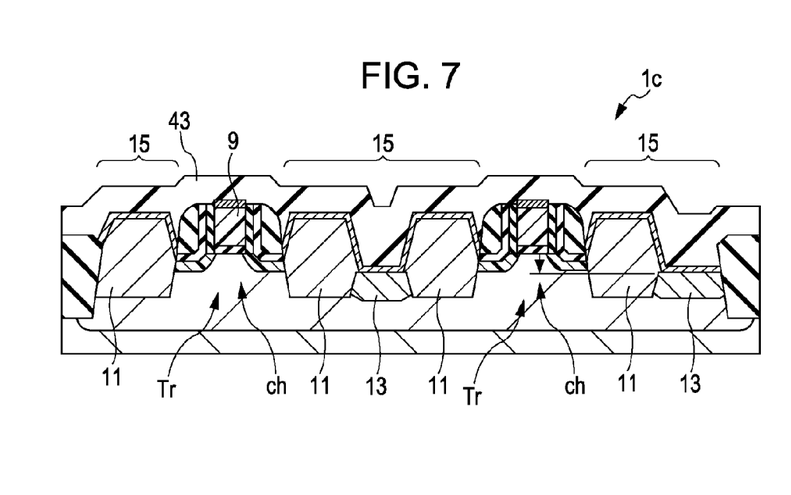
FIG. 7 is a schematic cross-sectional view showing a structure of a semiconductor device according to a third embodiment of the present invention.

FIG. 7 is a schematic cross-sectional view showing a structure of a semiconductor device according to a third embodiment of the present invention. A semiconductor device 1c shown in FIG. 7 has the same structure as the semiconductor device 1a shown in FIG. 1 according to the first embodiment except that the height of the surface of the diffusion layers 13 constituting the source/drain regions 15 is lower than the height of the surface of the semiconductor substrate 3 beneath the gate electrodes 9.

In the semiconductor device 1c having such a structure, the stress film 43 covering the transistors Tr is extended to the position lower than the channel regions ch. Thereby, in addition to the effect of the first embodiment, the effect of application of stress to the channel regions ch by the stress film 43 can be enhanced.

Fourth Embodiment

Figure 8:
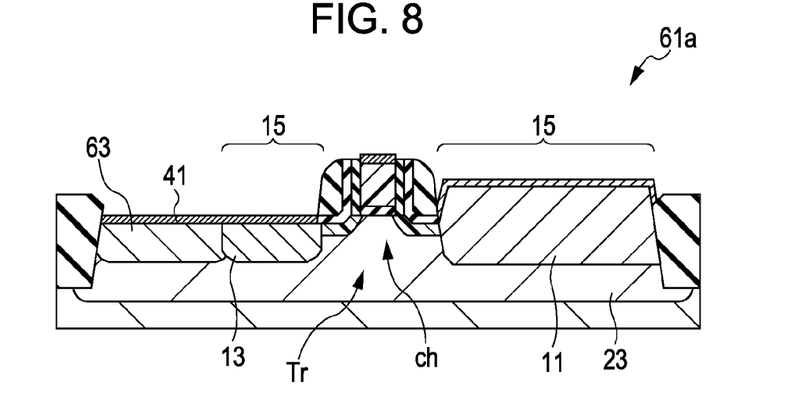
FIG. 8 is a schematic cross-sectional view showing a structure of a semiconductor device according to a fourth embodiment of the present invention.

FIG. 8 is a schematic cross-sectional view showing a structure of a semiconductor device according to a fourth embodiment of the present invention. A semiconductor device 61a shown in FIG. 8 has a structure provided with a p-type MOS transistor Tr. The semiconductor device 61a differs from the semiconductor device 1a shown in FIG. 1 according to the first embodiment in that only one of the source/drain regions 15 includes an epitaxial layer 11, and the other of the source/drain regions 15 includes a diffusion layer 13 only. Furthermore, a diffusion layer of opposite conductivity type (n-type) (opposite-conductivity-type diffusion layer 63) is disposed adjacent to the diffusion layer 13. Duplicate description on the same structure as that in the first embodiment will be omitted.

In the semiconductor device 61a, the opposite-conductivity-type diffusion layer 63 is provided as a contact region with respect to the well diffusion layer 23. The opposite-conductivity-type diffusion layer 63 and the source/drain region 15 disposed adjacent thereto are short-circuited by a silicide layer 41 disposed over the surfaces thereof. In the semiconductor device 61a, by employing such a structure, the well contact is reduced.

In such a structure, since the diffusion layer 13 constitutes the source/drain region 15 disposed adjacent to and short-circuited to the contact region with respect to the well diffusion layer 23 (opposite-conductivity-type diffusion layer 63), it is possible to prevent the n-type impurity in the opposite-conductivity-type diffusion layer 63 from diffusing into the source/drain region 15 and reaching the channel region ch.

Figure 9:
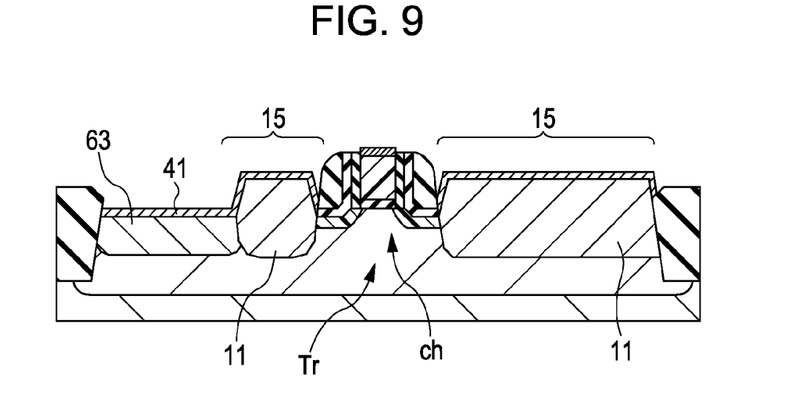
FIG. 9 is a schematic cross-sectional view showing a comparative example to the fourth embodiment.

That is, as shown in a comparative example of FIG. 9, in the case where an epitaxial layer 11 composed of silicon germanium (SiGe) constitutes the source/drain region 15 disposed adjacent to an opposite-conductivity-type diffusion layer 63, the n-type impurity in the opposite-conductivity-type diffusion layer 63 easily diffuses into the epitaxial layer 11 and reaches the channel region ch. The reason for this is that the diffusion rate of the n-type impurity in SiGe is higher than in the semiconductor substrate composed of silicon, i.e., in the case of arsenic (As), about seven times higher, and in the case of phosphorus (P), about two times higher.

Consequently, as shown in FIG. 8, by employing the structure in which only one of the source/drain regions 15 includes the epitaxial layer 11, and the other of the source/drain regions 15 disposed adjacent to the opposite-conductivity-type diffusion layer 63 includes the diffusion layer 13, it is possible to prevent the n-type impurity in the opposite-conductivity-type diffusion layer 63 from diffusing into the channel region ch, and the variation in the threshold of the p-type MOS transistor Tr can be suppressed.

Fifth Embodiment

Figure 10:
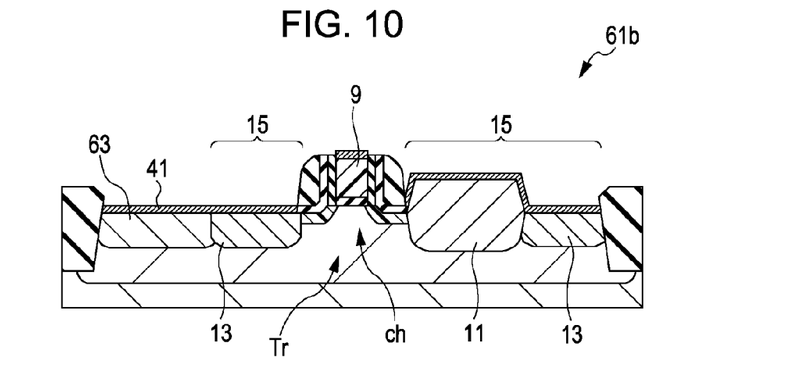
FIG. 10 is a schematic cross-sectional view showing a structure of a semiconductor device according to a fifth embodiment of the present invention.

FIG. 10 is a schematic cross-sectional view showing a structure of a semiconductor device according to a fifth embodiment of the present invention. A semiconductor device 61b shown in FIG. 10 has the same structure as the semiconductor device 61a according to the fourth embodiment except that one of the source/drain regions 15 includes a diffusion layer 13 together with the epitaxial layer 11.

In such a case, the diffusion layer 13 is disposed at the side of the gate electrode 9 through the epitaxial layer 11.

By employing such a structure, the width in the channel length direction of the epitaxial layer 11 can be set to a predetermined width W controlled by the diffusion layer 13. Thus, the same effect as that of the first embodiment can be obtained.

It should be understood by those skilled in the art that various modifications, combinations, sub-combinations and alterations may occur depending on design requirements and other factors insofar as they are within the scope of the appended claims or the equivalents thereof.

What is claimed is:

1. A method for manufacturing a semiconductor device comprising:
    forming a well diffusion layer in a semiconductor substrate by ion implantation;
    forming a gate electrode on the well diffusion layer of the semiconductor substrate;
    forming at least one insulating film over the entire well diffusion layer, the at least one insulating film being over the gate electrode;
    forming a recessed portion extending through the at least one insulating film and within the well diffusion layer of the semiconductor substrate at a side of the gate electrode;
    forming an epitaxial layer comprising a semiconductor material having a lattice constant different from that of the semiconductor substrate, the epitaxial layer being formed on the recessed portion of the well diffusion layer of the semiconductor substrate while the at least one insulating film remains over the well diffusion layer except at the recessed portion;
    forming a sidewall for the gate electrode from a portion of the at least insulating film that is between the gate electrode and the recessed portion while selectively removing other portions of the at least one insulating film from the well diffusion layer; and
    diffusing impurities into the epitaxial layer and a surface portion of the semiconductor substrate, the surface portion with the impurities being a diffusion layer,
    wherein,
        the sidewall is formed after the epitaxial layer is formed,
        the epitaxial layer is between the gate electrode and the diffusion layer along a width direction,
        source/drain regions include the epitaxial layer with the impurities and the diffusion layer.

2. The method of claim 1, further comprising:
    forming a recessed portion on an opposite side of the gate electrode; and forming the epitaxial layer on the recessed portion on the opposite side of the gate electrode, wherein,
the diffusion layer is formed outside the epitaxial layer.

3. The method of claim 2, wherein the epitaxial layer is formed with a predetermined width along the width direction, the width direction corresponding to a channel length direction of a channel region associated with the gate electrode.

4. The method of claim 1, wherein:
one of the source/drain regions includes the epitaxial layer; and
the other of the source/drain regions includes only the diffusion layer.

5. The method of claim 1, wherein:
the semiconductor substrate is composed of silicon; and
the epitaxial layer is composed of silicon germanium.

6. The method of claim 1, wherein:
the semiconductor substrate is composed of silicon; and
the epitaxial layer is composed of silicon carbon.

7. The method of claim 1, wherein the predetermined width of the epitaxial layer is in a range that includes 10 to 100 nm.

8. The method of claim 1, further comprising:
forming a stress film over a channel region associated with the gate electrode, the stress film comprising silicon nitride and being enabled to apply stress to the channel region.

9. A method for manufacturing a semiconductor device comprising:
forming a gate electrode on a semiconductor substrate;
forming a recessed portion on a surface of the semiconductor substrate at a side of the gate electrode;
forming an epitaxial layer comprising a semiconductor material having a lattice constant different from that of the semiconductor substrate, the epitaxial layer being formed on the recessed portion of the semiconductor substrate;
diffusing impurities into the epitaxial layer and a surface portion of the semiconductor substrate, the surface portion with the impurities being a diffusion layer;
forming an opposite-conductivity-type diffusion layer having a different conductivity type from that of the diffusion layer to be adjacent to the diffusion layer; and
forming a silicide layer over source/drain regions and the opposite-conductivity-type diffusion layer, wherein,
the source/drain regions include a first source/drain region and a second source/drain region;
the first source/drain region includes the epitaxial layer,
the second source/drain region includes only the diffusion layer, and
the diffusion layer and the opposite-conductivity-type diffusion layer are configured to be short-circuited by the silicide layer.

10. A method for manufacturing a semiconductor device comprising:
forming a well diffusion layer in a semiconductor substrate by ion implantation;
forming a gate electrode on the well diffusion layer of the semiconductor substrate;
forming at least one insulating film over the entire well diffusion layer, the at least one insulating film being over the gate electrode;
forming a recessed portion extending through the at least one insulating film and within the well diffusion layer of the semiconductor substrate at a side of the gate electrode;
forming an epitaxial layer comprising a semiconductor material having a lattice constant different from that of the semiconductor substrate, the epitaxial layer being formed on the recessed portion of the well diffusion layer of the semiconductor substrate while the at least one insulating film remains over the well diffusion layer except at the recessed portion;
forming a sidewall for the gate electrode from a portion of the at least insulating film that is between the gate electrode and the recessed portion while selectively removing other portions of the at least one insulating film from the well diffusion layer; and
diffusing impurities into the epitaxial layer and a surface portion of the well diffusion layer of the semiconductor substrate, the surface portion with the impurities being a diffusion layer, wherein,
the sidewall is formed after the epitaxial layer is formed,
source/drain regions include a first source/drain region and a second source/drain region,
the first source/drain region includes the epitaxial layer,
the second source/drain region includes only the diffusion layer, and
the diffusion layer is disposed outside of the epitaxial layer.

11. The method of claim 10, further comprising:
forming a stress film over a channel region associated with the gate electrode, the stress film comprising silicon nitride and being enabled to apply stress to the channel region.

12. A method for manufacturing a semiconductor device comprising:
forming a gate electrode on a semiconductor substrate;
forming a recessed portion on a surface of the semiconductor substrate at a side of the gate electrode;
forming an epitaxial layer comprising a semiconductor material having a lattice constant different from that of the semiconductor substrate, the epitaxial layer being formed on the recessed portion of the semiconductor substrate; and
diffusing impurities into the epitaxial layer and a surface portion of the semiconductor substrate, the surface portion with the impurities being a diffusion layer, wherein,
the epitaxial layer is between the gate electrode and the diffusion layer along a width direction,
source/drain regions include the epitaxial layer with the impurities and the diffusion layer, and
a depth of the diffusion layer within the semiconductor substrate is greater than a depth of that of the epitaxial layer within the semiconductor substrate.

* * * * *